United States Patent [19]

Zasio et al.

[11] 4,442,361

[45] Apr. 10, 1984

[54] SYSTEM AND METHOD FOR CALIBRATING ELECTRON BEAM SYSTEMS

[75] Inventors: John Zasio, Sunnyvale; Larry Cooke, Cupertino; Raymond Paul, Soquel, all of Calif.

[73] Assignee: Storage Technology Partners (through STC Computer Research Corporation, managing general partner), Santa Clara, Calif.

[21] Appl. No.: 429,948

[22] Filed: Sep. 30, 1982

[51] Int. Cl.³ ........................................ H01J 37/304
[52] U.S. Cl. .............................. 250/491.1; 250/492.2
[58] Field of Search ........................ 250/491.1, 492.2

[56] References Cited

PUBLICATIONS

Asai et al., "Distortion Correction . . . ", *J. Vac. Sci. Technol.*, vol. 16, No. 6, Nov./Dec. 1979, pp. 1710–1714.

Alles et al., "Control System Design . . . ", *J. Vac. Sci. Technol.*, vol. 12, No. 6, Nov./Dec. 1975, pp. 1252–1256.

Engelke et al., "Correction of Nonlinear Distortion . . . ", IBM J. Res. Develop., vol. 21, Nov. 1977, pp. 506–513.

*Primary Examiner*—Alfred E. Smith
*Assistant Examiner*—Jack I. Berman
*Attorney, Agent, or Firm*—Bryant R. Gold

[57] ABSTRACT

A system and method for calibrating scanning beam systems, such as electron beam systems, so that a plurality of such systems are compatible one with another, thereby allowing an object that is scanned on one system to be transferred to another system while still maintaining proper alignment between the pattern(s) scanned on the object by one system and the pattern(s) scanned on the object by another system. A calibration plate, having an array of calibration marks thereon at prescribed locations, is made on a first system. This plate is then transferred to a second system where the location of the calibration marks is measured. The measured locations are fitted mathematically to the prescribed locations in order to minimize error. Nonetheless, some error will be present due to the slight misalignments and nonlinearities, such as mirror distortion, that are present between any two scanning beam systems. This error is determined by comparing the fitted measured locations to the prescribed locations. An error map is created that characterizes this error by location, for the particular scanning beam system being calibrated. The information contained in this error map is used to subsequently compensate the movement of the calibrated system, using interpolation when necessary, so that the movements of the calibrated system accurately track, and hence are aligned with, the movements of the first system. Internal compensation may also be performed on each system to account for known errors and nonlinearities associated with the operation of the individual system.

17 Claims, 14 Drawing Figures

SYSTEM AND METHOD FOR CALIBRATING ELECTRON BEAM SYSTEMS

BACKGROUND OF THE INVENTION

This invention relates to the fabrication of large scale integration (LSI) and very large scale integration (VLSI) circuit chips, and more particularly to an automated high-speed electron beam system which is used as a tool in the fabrication of such chips. Even more particularly, the invention relates to a process whereby electron beam systems can be made compatible with each other, allowing more than one electron beam system to be used in the fabrication of the same chips.

When an integrated circuit chip is fabricated, it is one of many chips on a wafer of semiconductor material. Prior to each step in the fabrication process, the wafer is coated with a photographic type material called a resist. The resist is then exposed, by one of a variety of techniques, with an integrated circuit pattern corresponding to the next step of the process.

After being exposed, the resist is developed, uncovering those areas of the wafer that are to be subjected to the next step of the process and protecting those areas that are not to be affected. When the fabrication process is complete, the wafer is scribed along the unused channels between the chips and the individual chips are broken off from the wafer.

As integrated circuit technology has improved, the dimensions of the individual circuits on a chip have decreased, allowing a higher density of circuits per unit area. The higher circuit density, along with improved fabrication techniques and a desire for more functions per chip, have resulted in what is now called LSI and VLSI. The higher circuit densities associated with LSI & VLSI, as well as the larger chip size that has resulted from improved fabrication techniques, have required that the circuit patterns used for each step of the fabrication process be made more accurately so as to align with each other. The high resolution of an electron beam system makes it a good tool for generating the required circuit patterns.

When an electron beam system is used to generate the circuit pattern of a wafer, there are two basic ways in which the exposure can be made:

(1) expose the desired pattern directly on the resist coated wafer; and (2) create a mask that has the desired pattern.

The direct wafer exposure has the advantage of greater resolution since an electron beam, rather than light waves, is being used to make the exposure. However, it has the disadvantage of requiring that the wafer be removed from the electron beam system after each exposure for the next step of processing and then, after processing, be precisely aligned within the electron beam system for the next exposure.

When masks are used, a glass plate, which has had a metal film deposited on it and a resist over the metal film, is exposed with the desired circuit pattern by the electron beam system. After developing, the metal film that remains on the glass plate is the circuit pattern for one process step for one chip. This pattern is typically made at a 10:1 size and is called a reticle. A separate reticle is required for each step of the fabrication process. The reticle is used in a direct-step-on-wafer (DSW) system which reduces the pattern by a factor of ten and exposes it on the wafer. The DSW system then steps the pattern to the next chip location on the wafer and exposes it. This process is repeated until every chip location on the wafer has been exposed with the desired pattern.

The area over which an electron beam can be accurately deflected, called the field, is typically several hundred microns square. This is very small compared to the size of the chip. To overcome this limitation, the chip circuit pattern to be exposed is divided into the appropriate number of scan fields, each not exceeding the field size of the electron beam system.

The device to be exposed (wafer or glass plate) is mounted on a stage which is movable in both the X and Y direction. The stage is positioned at the first scan field location and all the circuit patterns of the scan field are exposed by the electron beam system. The electron beam is then turned off, or blanked, and the stage is moved so that an adjacent scan field of the circuit pattern is aligned under the electron beam. The electron beam is then turned on and the circuit pattern within that scan field is exposed. This process is repeated until the entire circuit pattern has been exposed.

Electron beam systems are typically controlled by a computer. The circuit pattern to be exposed consists of a large number of rectangles; even a line is a rectangle, since it has a length and a finite width. Irregular shapes, if any, can be approximated by exposing a group of small rectangles. The data specifying the rectangles which represent the circuit pattern and the data specifying the stage positions are stored in either the computer's memory or in some storage device external to the computer until it is ready to be sent to the electron beam system.

The computer program causes this data to be transmitted to the electron beam system controller which uses it to move the electron beam over all the rectangles in the scan field. The stage is then positioned to an adjacent scan field, with the beam blanked. This scan field is exposed, and so on. Exemplary prior art electron beam systems are described in U.S. Pat. Nos. 4,132,898 and 4,147,937.

The position of the electron beam within the field is controlled electromagnetically by controlling the current supplied to the deflection coils. The amount of current required to deflect the beam a given amount can be precisely determined and the electronic circuitry that provides the control can be designed accordingly.

Two deflection coils, one for the X direction and one for the Y direction are used to position the electron beam anywhere within the field. The XY coordinate system resulting from the two coils does not have truly perpendicular axes because of the physical impossibility of mounting the coils at exact right angles. The deflection coordinate system will also be rotated some amount from the coordinate system of the stage. Calibration procedures have been devised to electronically compensate the current supplied to the deflection coils to correct for such perpendicularity and rotational problems.

The position of the stage, on which the device to be exposed is mounted, is controlled by a servo system using X and Y coordinates supplied by the computer program. Two mirrors are mounted on the stage, one in the X direction and one in the Y direction. A laser beam is reflected off these mirrors, by means of an interferometer, to an X receiver and Y receiver. These receivers convert the reflected laser beams to electrical signals that are proportional to the motion of the stage. These electrical signals, in turn, are fed back to the servo controller which uses them to control the position of the stage. The mirrors determine the X and Y axes of the stage coordinate system, and just as the deflection coils, can not be mounted exactly perpendicular to each other.

As mentioned previously, when all of the pattern in a given scan field is exposed, the stage is used to position an adjacent scan field under the electron beam so that another pattern can be exposed. If the coordinate system of the stage is not perpendicular, and is rotated with respect to the coordinate system of the electron beam, then the exposed scan fields will not truly butt up against each other. In some cases, the scan fields may overlap and in others there may be a gap between them.

Since the circuit patterns being exposed cross the boundaries of the scan fields, this would result in wafers or masks that are not usable. Calibration procedures are known in the art that measure the perpendicularity and rotation of the stage coordinate system. The computer program uses these measured values to determine the constants k for a set of linear transformation equations. Whenever the stage is to be positioned to a new scan field location at a specified coordinate X,Y, the computer program transforms the coordinates to X',Y', using the linear transformation equations. The coordinates X',Y' are sent to the servo system and compensate for perpendicularity and rotation problems.

Thus, techniques are known in the art to correct the perpendicularity and rotation problems of the two coordinate systems involved in an electron beam exposure system. Unfortunately, these techniques still have positional errors associated with them as large as several microns over a distance of several milli-meters. However, as long as all masks or wafers are exposed on the same electron beam system, they all have the same minor distortion, and they can be used in the fabrication of LSI and VLSI circuits.

The positional error referred to in the preceeding paragraph is primarily caused by the fact that the mirrors mounted on the stage are not absolutely flat and distort the feedback signal to the servo controller. Unfortunately, glass plates, exposed on two different electron beam systems, are not compatible, even if all the perpendicularity and rotation corrections were made on each system, since the positional error caused by the mirror distortion of the two systems may cause pattern defects at different coordinates.

As described above, it should be evident that a significant drawback of prior art electron beam systems, when used as a tool in the fabrication of LSI and VLSI circuits, is their noncompatibility due to positional and other errors. For example, the "master slice" technique is commonly used in LSI and VLSI technologies. With this technique, the process steps which form the circuit elements of the chips are the same for every wafer. Wafers are fabricated, using a set of masks that form the master slice, and are stockpiled. Several additional process steps add the wiring, or metalization, that interconnects the circuits and causes the chip to perform the desired function. Because of positional errors, the masks which add the wiring must be made on the same electron beam system as those that were used to fabricate the masks of the master slice. This greatly limits the output capability of a wafer processing facility. Further, if an electron beam system has to have a mirror replaced, the replaced mirror will have a different distortion, and subsequent masks produced will not be compatible with previous masks. Since the electron beam system is a production tool used in the fabrication of VLSI masks, and since (as a production tool) it is desirable to increase wafer, mask, and/or interconnect throughput, it is seen that there is a great need in the art for compatible electron beam systems.

SUMMARY OF THE INVENTION

It is an object of the present invention to provide a method of making a number of electron beam exposure systems compatible with each other. Compatibility is realized by providing a means of adjusting the exposure systems such that the minor distortions of the patterns produced on each system are the same. The use of the invention allows a wafer, when the direct wafer exposure method is used, to have the pattern for any step of the process be exposed on any of the calibrated systems. If the reticle method is being used, the invention allows the glass plates required for the fabrication steps of the wafer to be exposed on any of the calibrated electron beam systems and intermixed when used in the fabrication steps of the wafer. Thus, the invention eliminates one of the major drawbacks of using electron beam exposure systems in the fabrication of LSI and VLSI circuit chips, i.e., the need to dedicate an entire wafer processing line to a single electron beam system is no longer required.

The invention meets the above and other objectives by exposing a calibration plate (typically made of glass) with an array of calibration marks in one electron beam system and measuring their location in another electron beam system. If these location measurements are in error, it will primarily be because the mirrors used in the laser interferometer system that provides positional information to the servo system are not perfectly flat, i.e., the mirrors introduce a minor distortion in the position signal. The present invention advantageously performs a two dimensional least squares calculation on the measured location data to "fit" it to the array on which it was exposed. The result of this calculation is a set of coordinates for the measured locations of the calibration marks. This set of coordinates may still be in error if the calibration plate was not positioned exactly when it was inserted into the electron beam system. A linear transformation is therefore performed to correct the data for this insertion error. The differences between this final set of calculated coordinates and the measured set of coordinates thus represents a set of errors introduced by the distortion of the mirrors.

Once the set of errors caused by mirror distoration is known, the present invention establishes an error map that has the coordinates of the points at which the calibration marks were exposed and the error at that point caused by the mirror distortion. Hence, when the system to be made compatible moves the stage to a new location, the four closest points to the new location are found on the error map. The four associated errors are used to perform a four way interpolation to adjust the coordinates of the new location to agree with the mirror distortion of the system in which the calibration plate was exposed. Thus, compatibility is achieved by having the second system selectively introduce an "error" in the stage position to simulate the effect of the mirror distortion of the first system.

BRIEF DESCRIPTION OF THE DRAWINGS

The invention will be described with reference to the accompanying drawings, wherein.

DESCRIPTION OF THE PREFERRED EMBODIMENT

The following is a description of the best presently contemplated mode of carrying out the invention. The description is given only for the purpose of illustrating the general principles involved in the invention and should not be taken in a limiting sense. The true scope of the invention can be determined by referring to the appended claims.

Figure 1:
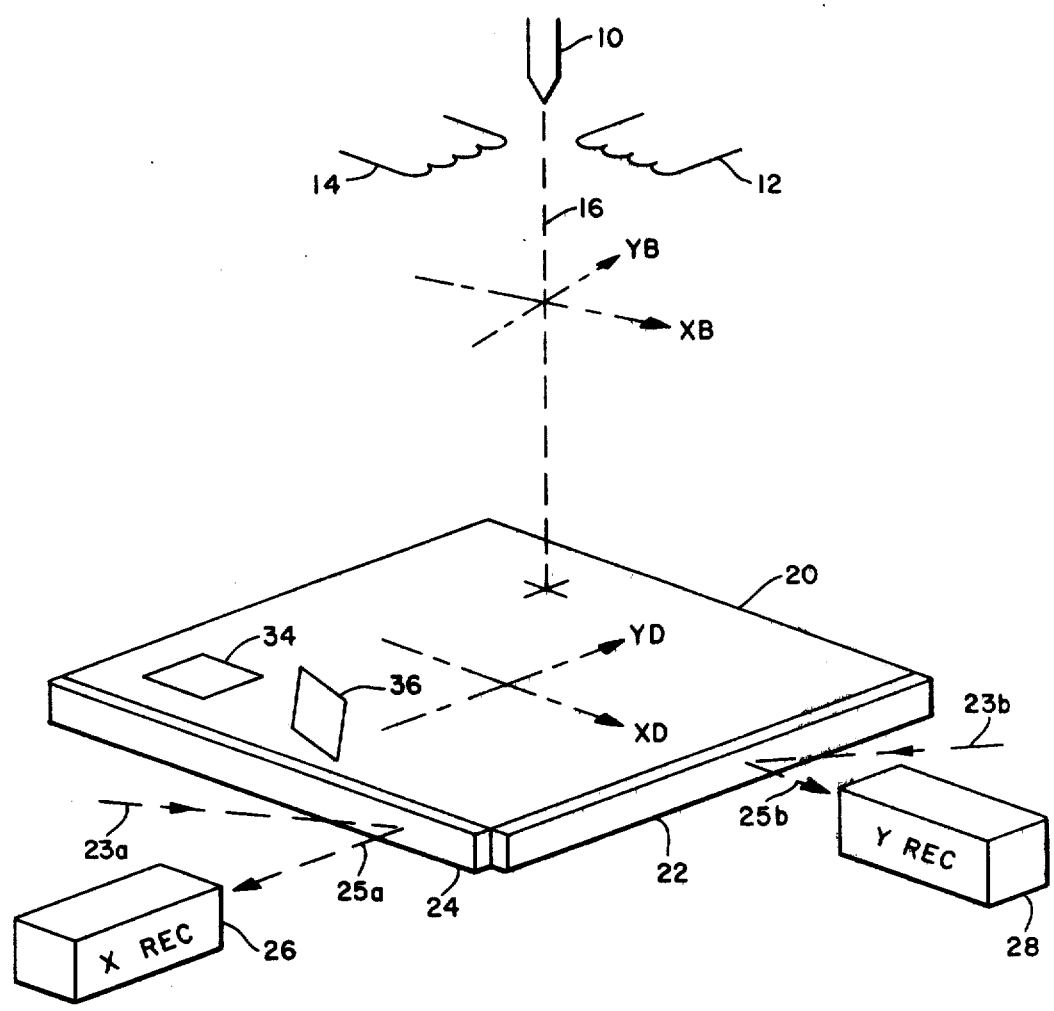
FIG. 1 is a pictorial representation showing the relationship of the various coordinate systems involved in an electron beam system.

Referring to FIG. 1, a pictorial representation of an electron beam exposure system is shown illustrating the various coordinate systems involved. An electron beam source 10 generates a beam of electrons 16 which is deflected in the X and Y directions by changing the currents in the X deflection coil 12 and Y deflection coil 14, respectively. The beam impinges on an object or device mounted on the stage 20.

Since the scan field of the electron beam is very small compared to the device on the stage 20, the stage 20 is moved in the X and Y direction, as necessary, to position new scan fields under the beam. The position of the stage 20 is controlled by a closed loop servo system. The positional feedback signal that closes the loop of the servo system is provided by a laser beam interferometer system, shown in FIG. 1 in simplified form to illustrate the use of the mirrors and other components of the system. Incident laser beams 23a and 23b reflect off the mirrors 24 and 22 respectively. These mirrors 24 and 22 move with the stage 20 in the X and Y direction, respectively. Reflected laser beams 25a and 25b are received by the X receiver 26 and Y receiver 28, respectively. These receivers 26 and 28 convert the interference pattern between the incident (or reference) beam 23a or 23b and the corresponding reflected beam 25a or 25b from the mirrors to electrical signals that indicate the relative movement of the stage 20 in the X and Y direction, respectively. The electrical signals are sent to a servo controller (not shown) as a feedback signal.

The coordinate system in which the electron beam is deflected is represented by the axes XB and YB. The coordinate system in which the stage is moved is represented by the axes XS and YS. These two coordinate systems are not necessarily in alignment because neither has perpendicular axes, and they may be rotated (as shown in an exaggerated fashion in FIG. 1) in the opposite direction.

The ideal coordinate system, in which it is desired to have both the electron beam deflected and the stage moved, is represented by the axes XD and YD. If this ideal coordinate system is used by the electron beam system to expose a rectangle, a desired shape, such as the rectangle 34, would be produced. If, however, the electron beam system is used with the deflection coordinate system XB-YB and stage coordinate system XS-YS to expose a similar rectangle, the result would be the distorted shape, represented by the trapezoid 36.

Figure 2:
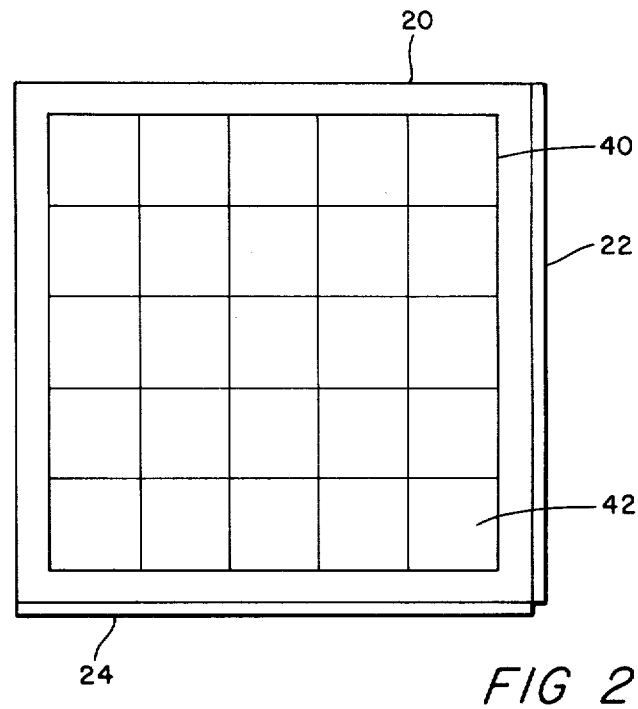
FIG. 2 illustrates how the scan fields of the electron beam system butt against each other.

FIG. 2 illustrates the effects of exposing a pattern with an electron beam system whose coordinate systems are in alignment, i.e., using the ideal coordinate system XD-YD of FIG. 1. The stage 20 holds the object or device 40 that is to be exposed. The object 40 would normally be circular but is shown as a square for simplicity. On the object 40 are exposed a multiplicity of scan fields 42, each scan field containing a very small portion of the circuit pattern to be exposed. For example, in an embodiment which can accomodate a five inch glass plate and which uses a scan field 512 microns square, more than 40,000 scan fields may be required to expose the circuit pattern.

As shown in FIG. 2, the scan fields butt against each other over the entire surface of the object 40 with no overlap and no gap. This means that the circuit pattern of one scan field will mate with the rest of the circuit pattern in the adjacent scan field with no discontinuities or distortions.

Figure 3:
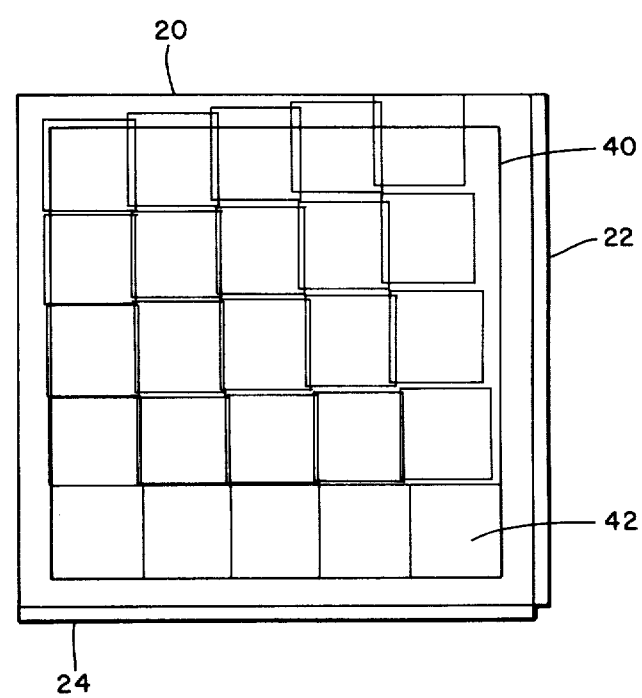
FIG. 3 shows the location of the scan fields as caused by the misalignment of the various coordinate systems of the electron beam system.

FIG. 3 illustrates the effect of exposing a pattern with an electron beam system whose coordinate systems are not in alignment, i.e., using the coordinate systems XB-YB and XS-YS of FIG. 1. The scan fields 42 are not exposed in the desired positions. In some places the scan fields overlap and in other places there are gaps between them. This virtually guarantees that circuit patterns exposed on such a system will not work because the pattern of one scan field will not be aligned with the pattern of an adjacent scan field.

Figure 4:
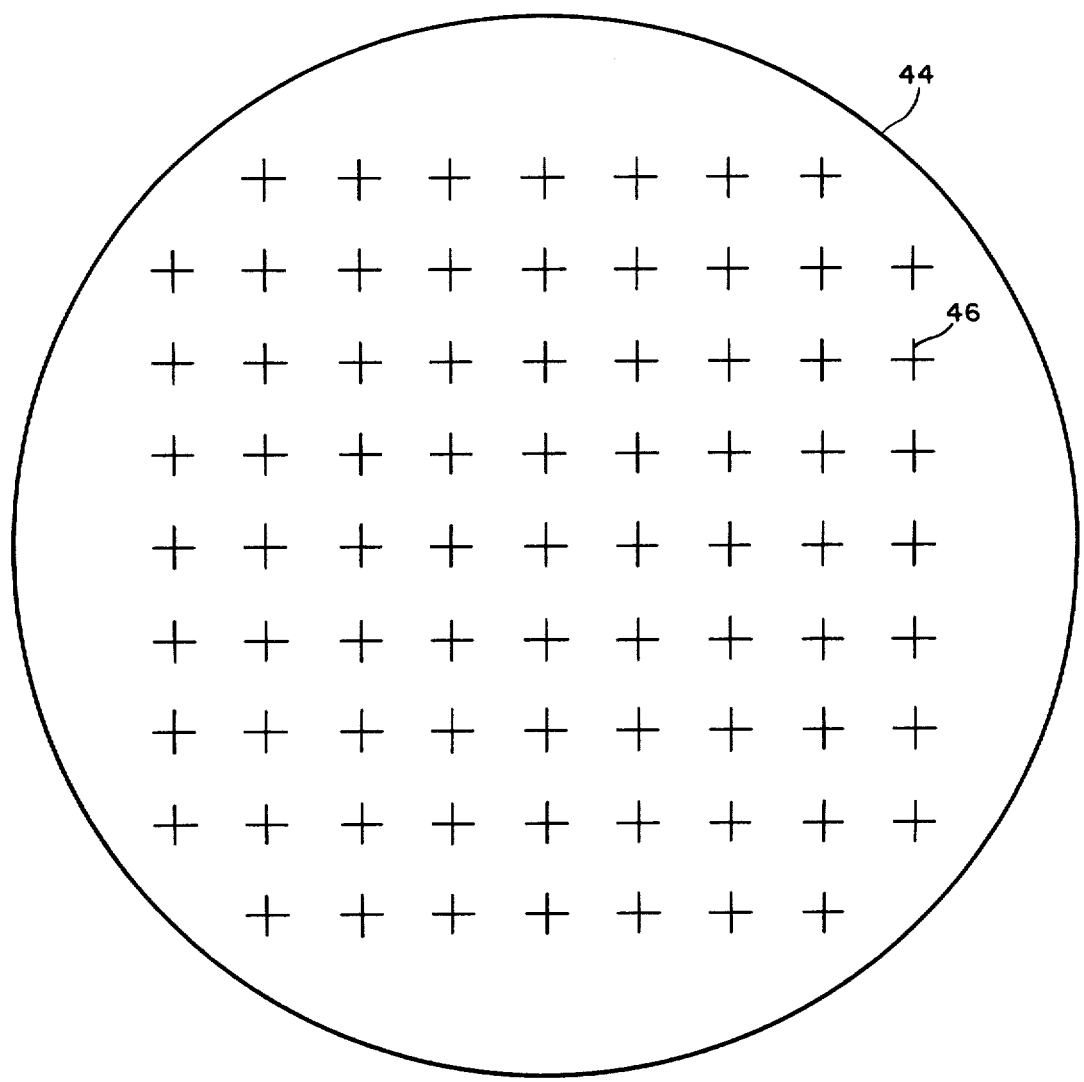
FIG. 4 shows a typical pattern of alignment crosses on a calibration plate.

FIG. 4 is a pictorial representation of the glass calibration plate used to correct the coordinate system of the stage XS-YS. The glass calibration plate 44 contains an array of alignment crosses 46 exposed on it. (It is to be emphasized that neither FIG. 4, nor any of the FIGS. 1-9, are drawn to scale in that the glass plate is several inches in diameter, the alignment crosses are typically separated by approximately ten milli-meters, and the crosses themselves are only a few microns in height and width.)

The calibration plate 44, with resist over the metal film, is exposed in an electron beam system. Each cross is exposed in the center of a scan field with the beam deflected only the amount necessary to expose the cross. This eliminates any significant positional error that might be introduced by the electron beam coordinate system if the electron beam had to be deflected away from the center of the field to expose the cross.

The glass calibration plate 44 is developed and inserted back in the same electron beam system and rotated 90-degrees. The new positions of the alignment crosses are measured using the electron beam system as a scanning electron microscope (SEM), and the differences in the cross positions are used to calculate the constants, A-F, for the linear transformation equations used to correct the stage coordinate system. The equations are:

$$X' = AX + BY + C$$
$$Y' = DX + EY + F$$

where X and Y are the desired coordinates, and X' and Y' are the actual coordinates used to position the stage. The equations do a linear transformation of the XY coordinate system into the X'Y' coordinate system. Each value of X' and Y' is proportional to the values X and Y, plus a constant.

The values of X' and Y' for each scan field of subsequent stage movements is calculated by the computer program and sent to the servo system to position the stage. This calibration is only performed periodically. The same glass plate is used for the calibration, but on subsequent calibrations, no exposure is performed; the alignment cross positions are measured once and the plate is rotated 90-degrees for the second measurement. The calibration plate 44 can only be used to calibrate the stage coordinate system of the electron beam system on which it was exposed.

Figure 5:
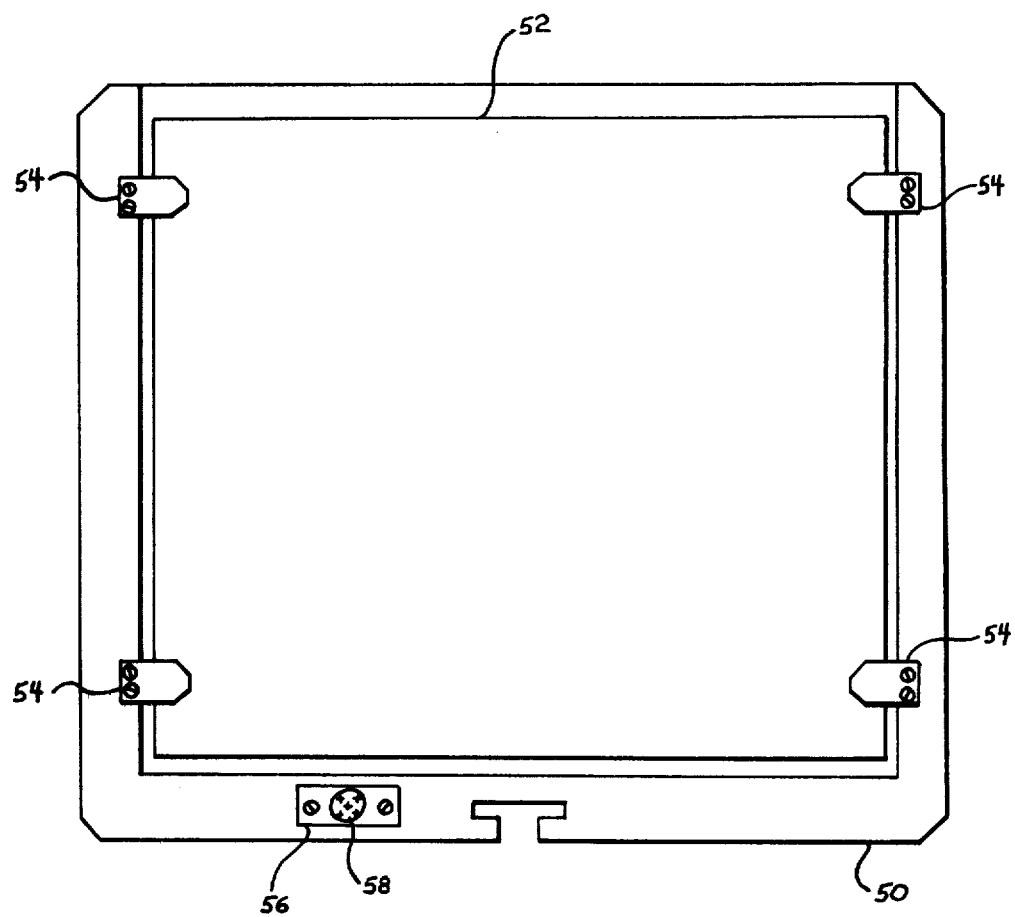
FIG. 5 is a sketch of a cassette adapted to hold the device to be exposed and to which an alignment chip is attached.

When a wafer or glass plate is exposed, it is mounted on a "cassette" which is inserted into a holding fixture on the stage. FIG. 5 shows the cassette. A piece of aluminum 50, or other suitable material, is machined to accept the object to be exposed 52, which is held in place by the spring clips 54. An alignment chip 58 is attached to a plate 56 which is rigidly attached to the frame 50.

Figure 6:
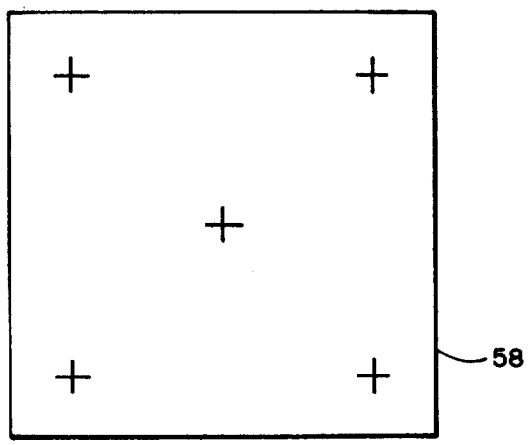
FIG. 6 shows a typical pattern of alignment crosses on the alignment chip attached to the cassette of FIG. 5.

FIG. 6 shows the five alignment crosses on the alignment chip 58. The alignment crosses are exposed on an electron beam system, whose stage coordinate system has previously been aligned, after the alignment chip 58 is permanently attached to the cassette. Since the cassette is rigidly held in a fixture on the stage, and the alignment chip is permanently affixed to the cassette, the alignment chip moves in the coordinate system of the stage. All five of the alignment crosses are exposed in the same scan field, one in the center and four near the corners. The exposure of the alignment chip 58 is made by moving the stage to center the position of the crosses under the electron beam and then moving the stage under the stationary beam the amount necessary to expose the cross.

When the cassette, holding the object or device to be exposed, is inserted in the electron beam system, the operator, using the electron beam system as a SEM, positions the center alignment cross in the center of the viewing monitor screen. Then a four corner scan is done wherein the electron beam scans all four corner alignment crosses and each cross is projected into the appropriate quadrant of the viewing monitor screen. Since the alignment crosses seen on the screen are caused by the deflection of the electron beam (the stage is stationary), any rotation or non-perpendicularity of the alignment crosses observed on the screen is caused by the corresponding rotation or non-perpendicularity of the coordinate system of the electron beam deflection system with respect to the alignment chip 58, and therefore with respect to the stage coordinate system.

The operator then makes four electrical adjustments to the electron beam deflection systems to correct the perpendicularity and rotation of all four crosses. When the adjustments are completed, the computer program reads the amounts of the electrical adjustments made and loads them into digital to analog converters (DACs) in the electron beam deflection control circuitry where they will be used to compensate every beam deflection.

The coordinate system of the electron beam and that of the stage have now been brought into alignment. This second alignment procedure is performed every time a cassette is loaded in the system.

Since a glass plate, used as a reticle during one of the processing steps of the wafer, is only exposed once, its circuit pattern can be exposed after the electron beam and stage coordinate systems are aligned. If a wafer being exposed for the first time is in the cassette, it can also be exposed at this time. However, if a previously exposed wafer is in the cassette, a third coordinate system, that of the circuit pattern already on the wafer (which may be thought of as a "wafer coordinate system"), has been introduced. Since it is physically impossible to mount the wafer in the cassette in exactly the same manner every time, the existing circuit pattern on the wafer will not be in alignment with the electron beam/stage coordinate system and additional calibration will be required.

Figure 7:
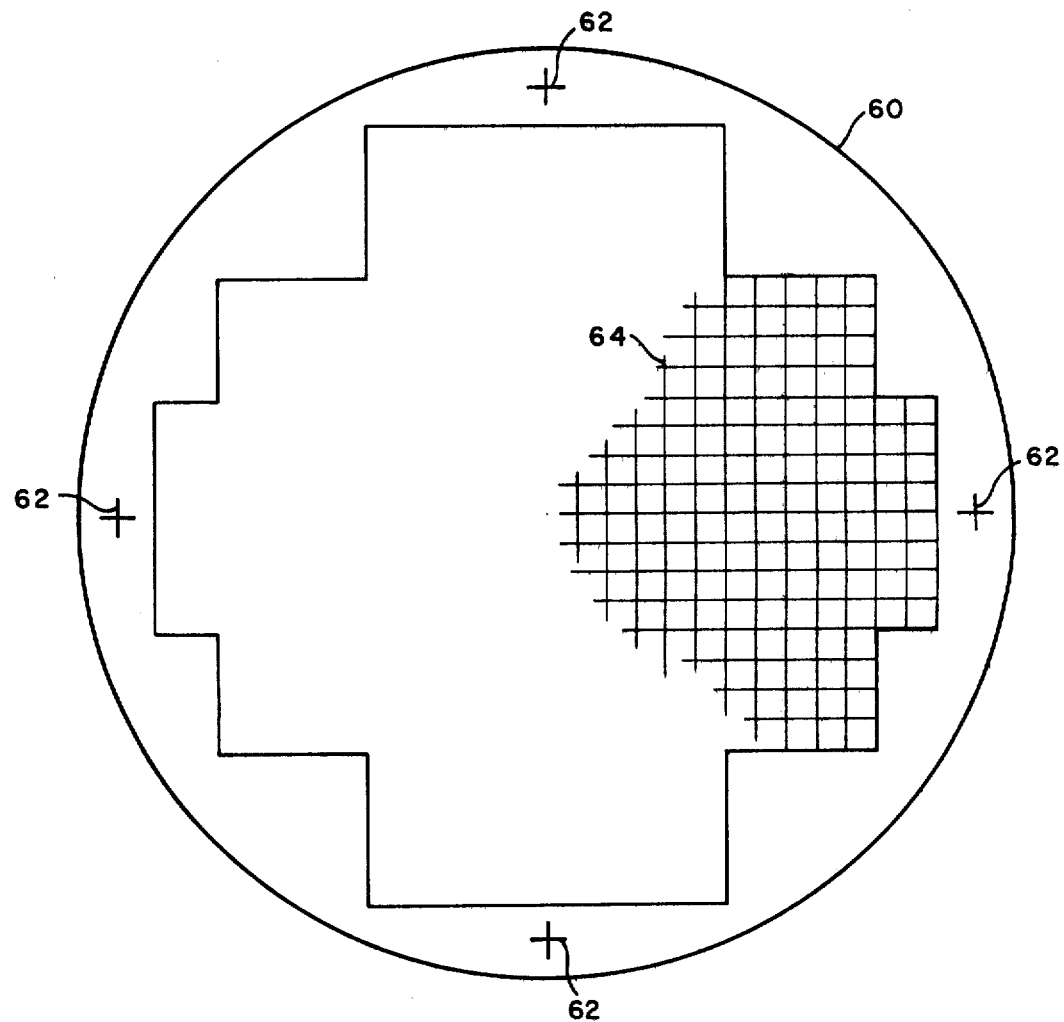
FIG. 7 illustrates the pattern of alignment crosses on a wafer.

FIG. 7 shows a typical wafer 60. At the center of the top, bottom, left and right sides of the wafer alignment crosses 62 which are exposed when the first circuit pattern is exposed on the wafer. A multiplicity of chips, arranged in an array 64, are also exposed on the chip. The area of each chip consists of many scan fields, depending upon the physical size of the chip.

As in the case of the first calibration glass plate described above, the four alignment crosses 62, when exposed, are exposed in the center of a scan field with the electron beam being moved only the amount necessary to expose the crosses, and without deflecting the exposing beam. Then, using the electron beam system as an SEM, the operator measures the actual stage position of the four crosses. The computer program uses the difference between the measured locations and the locations at which they were exposed to calculate new constants, A-F, for the linear transformation coordinates. Thus, when the stage is moved to align another scan field under the electron beam, the scan field exposed on previous exposures will be aligned under the beam.

Figure 8:
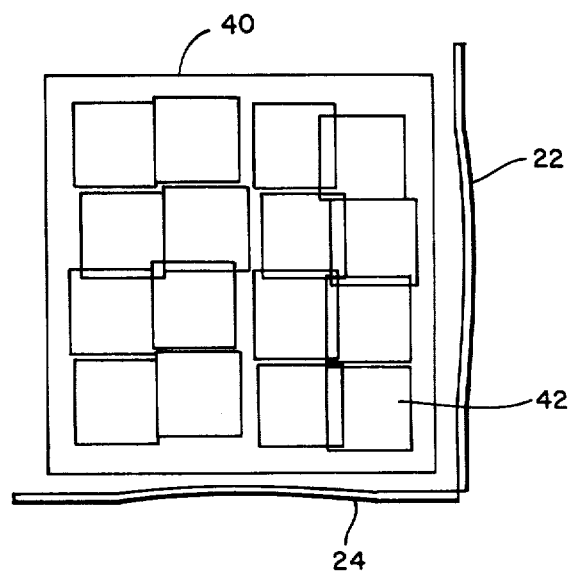
FIG. 8 depicts the effect of mirror distortion on the location of the scan fields.

After calibrating an electron beam system in the manner discussed up to this point, the scan fields would butt up against each other as shown in FIG. 2 if it were not for the distortion of the mirrors used in the laser beam. Referring to FIG. 8, the effect of the mirror distortion is shown. FIG. 8 is similar to FIG. 3 except that the mirrors 22 and 24 are shown with bows in them, representing the distortion, and the gaps between scan fields and the overlapping scan fields are caused by the mirror distortion rather than the non-aligned coordinate systems as was the case in FIG. 3. FIG. 8, of course, exaggerates this point. The mirrors actually have an unperceptible waviness to their surface rather than the single bowed section shown. This distortion causes a very minor error in position in some, but not all, of the scan fields, not the large percentage error indicated in the figure. The error is typically only a few microns over a distance of tens of millimeters.

The mirror distortion for a given calibrated electron beam system will always produce the defects in the same place for every exposure, whether it is exposing a glass plate or a wafer. If the same electron beam system is used, the defects will not affect the operation of the chips unless the mirror distortion is abnormal. The yield of good chips from a VLSI wafer is only about ten percent. A few of the failures may be caused by the inherent defects discussed above, but most are caused by the complexities of the processes involved in fabricating the VLSI wafers.

If it were not for the non-linearities of the mirrors used in the laser interferometer feedback system, a number of electron beam systems calibrated in the above manner would produce compatible glass plates and wafers. However, because such mirror non-linearities exist, the individual stage coordinate systems must be made compatible and the distortion of the individual mirrors must be compensated for so that any non-linearities are consistently handled. Once this is done, the coordinate system of the electron beam deflection system and stage coordinate system of the individual electron beam systems can be aligned by means of the alignment chip, as explained above.

As briefly explained in the summary of the invention, a glass calibration plate with an array of alignment crosses, which were exposed in one system, has the alignment cross locations measured in another system. Mathematically, it can be shown that when trying to fit a set of observed data, i.e., the set of measured locations on the second system, to a set of known data, i.e., the set of locations at which the alignment crosses were exposed on the first system, the least squares method will yield a fit that has the minimum error. The concepts involved in the least squares fit method are will known to those skilled in mathematical art and are explained in textbooks on numerical analysis. Accordingly, such method will not be discussed here. In the present invention, the computer program performs a two-dimensional least squares fit of the measured X,Y locations to the exposed X,Y locations.

The set of points resulting from the least squares calculation may still be in error because the calibration plate may have been rotated slightly when it was inserted for measurement, and the mirrors on both systems may not be exactly perpendicular. The computer program then generates the constants a-f for the linear transformation equations:

$$X(calc) = aX + bY + c, \text{ and}$$

$$Y(calc) = dX + eY + f.$$

X and Y are the prescribed coordinates where the first system exposed the alignment crosses, and X(calc) and Y(calc) are the calculated coordinates which correct X and Y for the rotation of the glass plate and the non-perpendicularity of the mirrors on both systems. Thus, X(calc) Y(calc) more nearly agree with the corresponding measured point than X,Y do. In fact, if there were no mirror distortion on either system and if the linear transformation equations were used to calculate the set of corrected coordinates X(calc), Y(calc) for all the locations of the alignment crosses, they would agree with the measured coordinates. However, there is mirror distortion and if the measured coordinates are called X(meas), Y(meas), then the error caused by the mirror distortion at each cross location is:

$$X(err) = X(meas) - X(calc)$$

$$Y(err) = Y(meas) - Y(calc)$$

The computer program calculates the error X(err), Y(err) for each coordinate at which the crosses were exposed. The program then makes an error map in the computer memory. The error map consists of a record for each coordinate at which the alignment crosses were originally commanded to be exposed.

Because of the mirror distortion of the first system, the alignment crosses may have been exposed slightly off from the commanded position. Each record in the error map contains the X,Y coordinate of an alignment cross and the error from that coordinate X(err), Y(err) as determined on the second system. The error map is used to correct each stage movement of the second system such that its movements track the non-linearities in the movement of the first system caused by the first system's mirror distortion.

Figure 9:
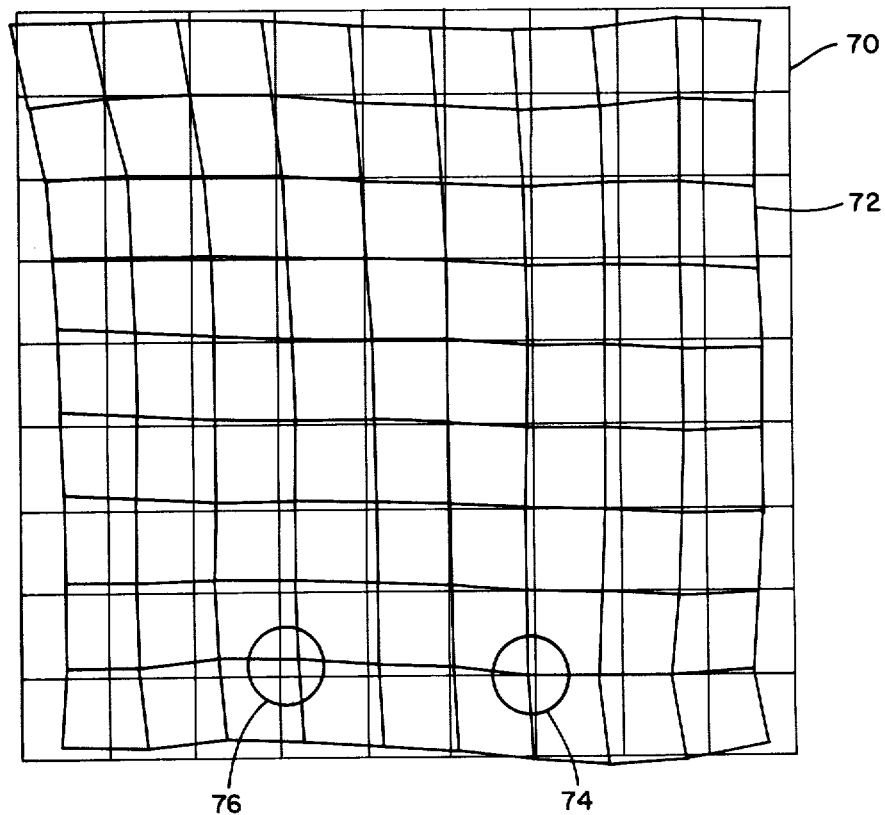
FIG. 9 represents an error map used to make two electron beam systems compatible.

A pictorial representation of an error map is shown in FIG. 9. Two grids are shown, the orderly grid 70 (light lines) and the non-orderly grid 72 (heavy lines). The intersection of the grid lines in the orderly grid 70 are the coordinates, X,Y that the computer of the first electron beam system used in exposing the array of alignment crosses on the glass calibration plate.

The intersection of the grid lines in the non-orderly grid 72 represent the errors, X(err),Y(err), of the alignment crosses as determined by the measurements and calculations on the second electron beam system. This grid indicates the amount of mirror distortion present between the two electron beam systems.

The amount of error for a given grid point in the orderly grid system 70 is therefore the distance from the grid point to the associated grid point in the non-orderly grid 72. For example, assuming a scale of five microns per division, the grid point 74 has approximately a one half micron error in the negative X direction and no error in Y direction; while the grid point 76 has an error of about one micron in both the positive X and positive Y directions.

The computer of the second electron beam system uses the error map to make its mirror distortion the same as that of the first system. When the stage is to be moved, the X,Y position on the error map is found and a four way interpolation, using the error values of the surrounding four grid points, is performed. Thus, the invention causes objects exposed on the second system to have the same non-linearities in the circuit pattern caused by mirror distortion as those caused by the mirror distortion on the first system.

Figure 10:
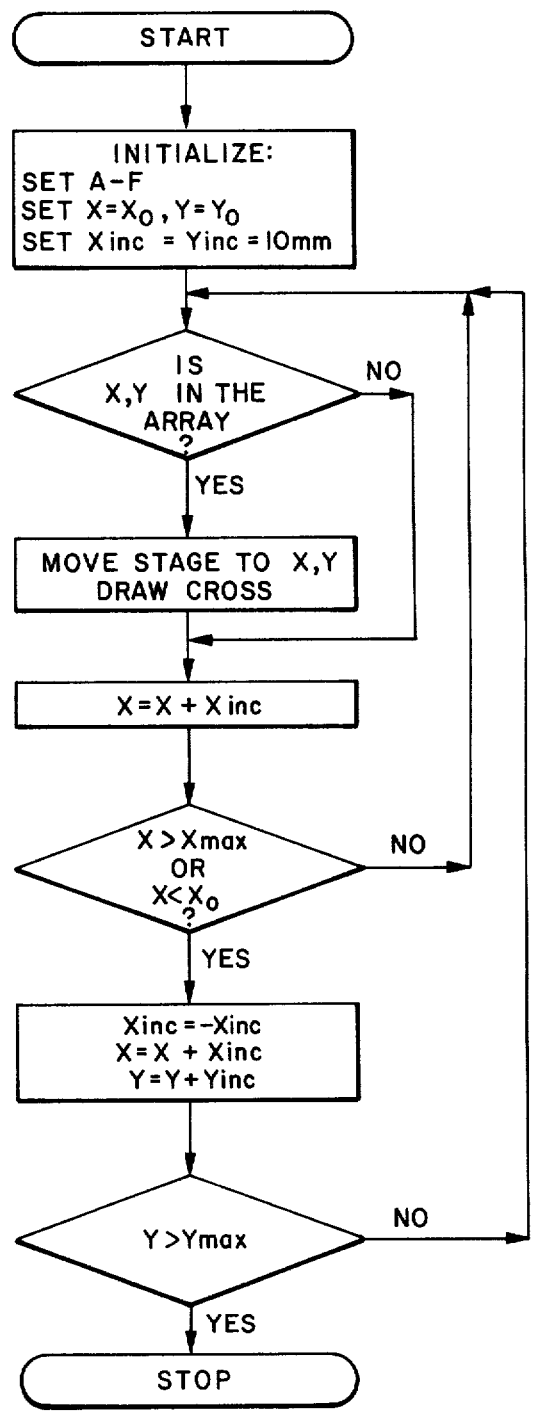
FIG. 10 is a flow chart representing how the alignment plate is exposed.

FIGS. 10 through 14 are flow charts showing the process used by the programs of the present invention. FIG. 10 is a flow chart which illustrates how the calibration plate 44 is exposed on the electron beam system which will serve as the reference system to which other electron beam systems will be made compatible. The exposure starts in the lower left corner of the array of alignment crosses. A cross is exposed and the stage is moved in the positive X direction one array increment. When the stage is moved beyond the right hand column of the array, the increment of X is made negative, Y is incremented one array increment and the second row of crosses are exposed in the negative X direction. This back and forth process of exposing alignment crosses is repeated until the entire array is exposed.

If the array of alignment crosses is large enough, the corner crosses may not fit on the circular glass plate, as illustrated in FIG. 4. As shown in FIG. 10, the program skips over those positions which are specified as not being part of the array.

Figure 11:
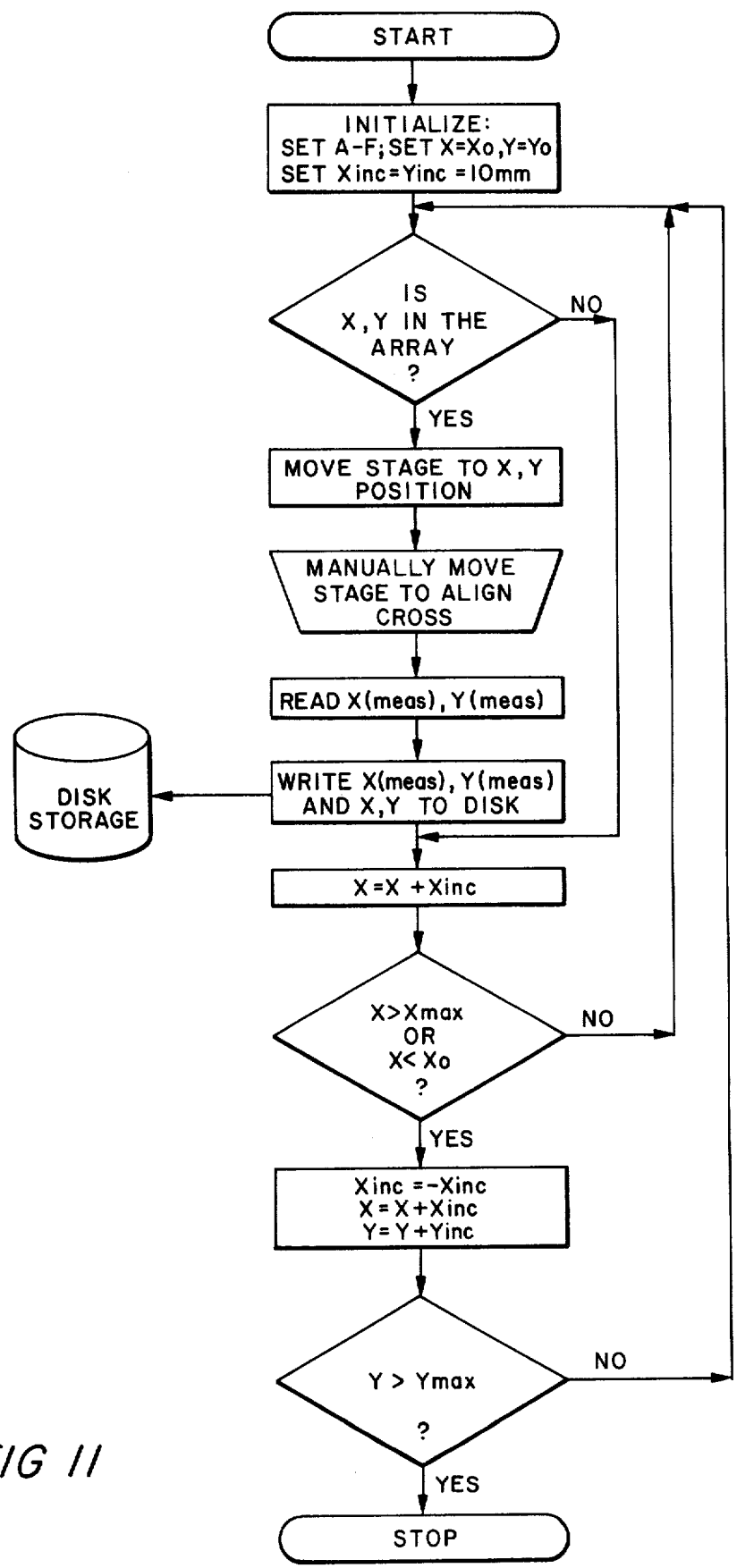
FIG. 11 is a flow chart indicating how the alignment crosses on the calibration plate are read on the electron beam system to be made compatible.

FIG. 11 is a flow chart illustrating how alignment crosses on the calibration plate are read on the electron beam system that is to be made compatible. The stage is moved in the same manner as when the alignment crosses were exposed. That is, in the positive X direction on the first row, negative X direction on the second row and so on, while skipping over those positions which were specified as not being part of the array.

When the stage is positioned at the X,Y coordinate at which the alignment cross was exposed, the operator, using the electron beam system as a SEM, manually moves the stage to align the cross in the center of the viewing monitor's screen. The coordinates of the stage at this point, X(meas),Y(meas), along with the coordinates X,Y are stored (typically on a disk, although other storage means could be used) and the stage is moved to the next alignment cross position. This process is repeated until the actual position of all the alignment crosses has been measured.

Figure 12:
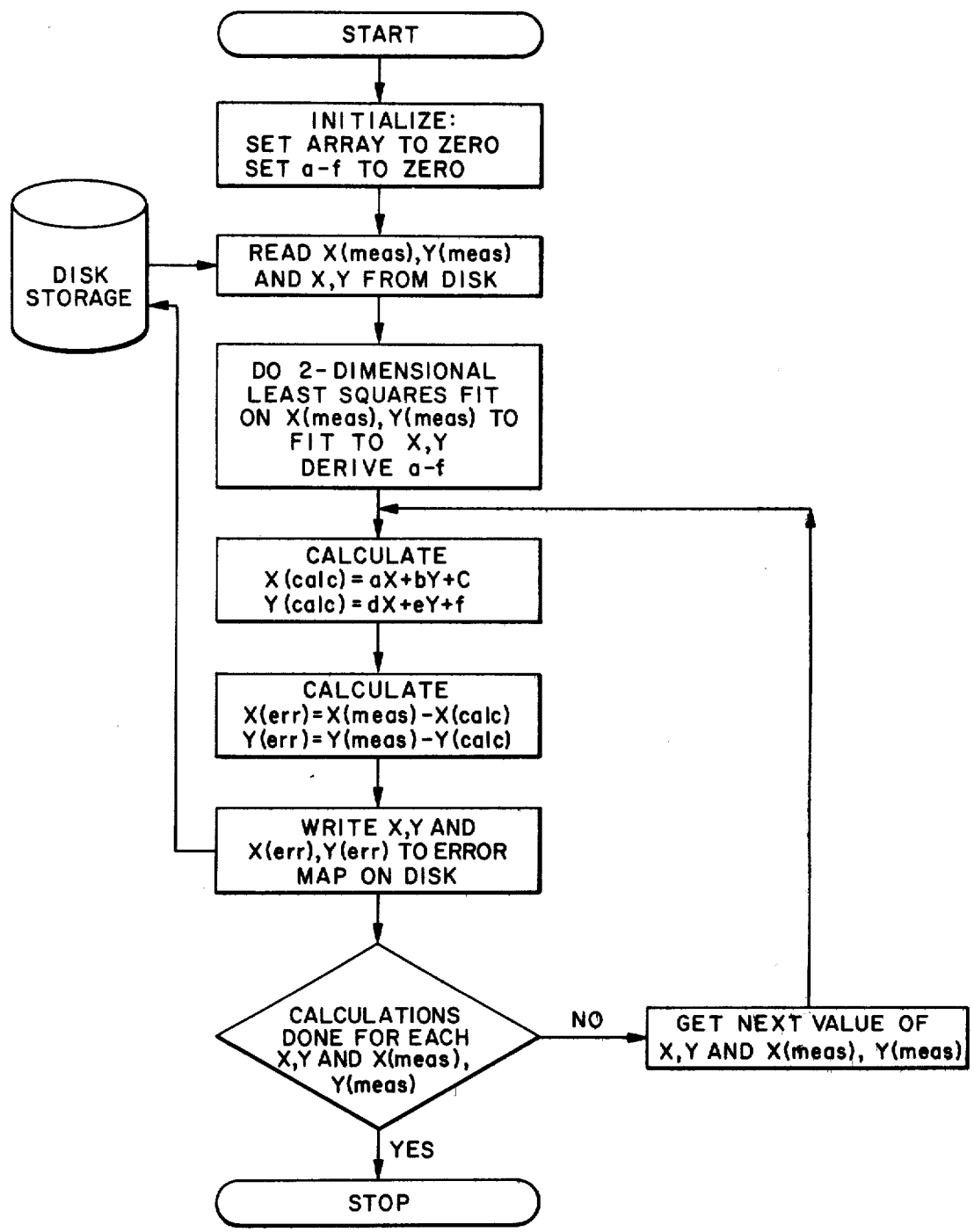
FIG. 12 is a flow chart showing the process used to create the error map.

FIG. 12 is a flow chart showing the process used to create the error map. The values of X(meas),Y(meas) and X,Y are read from storage. A two dimensional least squares calculation is performed on the set of X(meas),Y(meas) to fit it to the set X,Y and the linear transformation equation constants a-f are derived.

The linear transformation equations are used at each point X,Y to calculate the set of points X(calc),Y(calc). This transformation removes any error introduced by the physical rotation and translation of the glass calibration plate 44 when it was inserted in the system being made compatible.

The error, X(err), Y(err) at each point X,Y is calculated by subtracting X(calc) and Y(calc) (derived from the linear transformation) from X(meas) and Y(meas), respectively. The error map is created by storing a matrix of records on the disk, each record of the map comprising a coordinate X,Y at which an alignment cross was exposed, and the error, X(err), Y(err), at that point.

Figure 13:
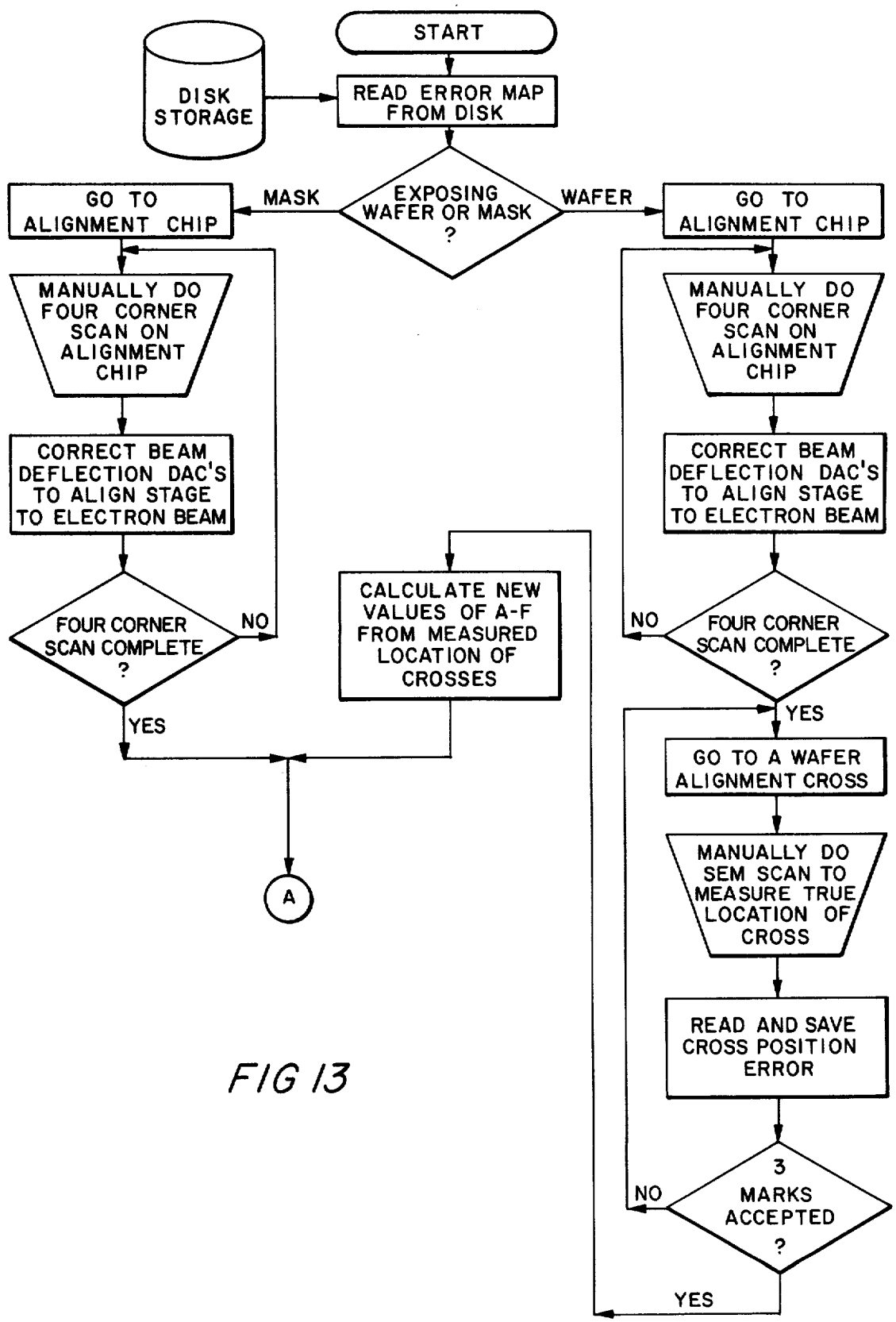
FIG. 13 is a flow chart showing the initial steps involved in calibrating an electron beam system according to the present invention.

FIG. 13 is a flow chart showing the initial steps involved in calibrating an electron beam system in order to expose a glass plate or a wafer. The flow chart assumes that the periodic adjustment using the glass plate rotated 90-degrees, described previously, has been done and that the constants of the linear transformation equations A-F, used to correct the rotation and non-perpendicularity of the stage, have been calculated.

If a mask is being exposed, the program moves the stage to the position of the alignment chip 58 mounted on the cassette 50. The operator, using the electron beam system as a SEM, performs the four corner scan, as described previously, to align the coordinate system of the electron beam deflection system with that of the stage.

If a wafer, previously exposed, is being exposed, the four corner scan is performed in the same manner as when a mask is being exposed. The program then moves the stage to the position of one of the four alignment crosses previously exposed on the wafer. The operator, using the electron beam system as a SEM, manually moves the stage to center the alignment cross in the viewing monitor's screen. The error in position is read by the computer and saved. When the position error of three of the four alignment crosses on the wafer have been measured, new values of A-F are calculated to correct for the rotation of the wafer when it was inserted into the electron beam system.

Figure 14:
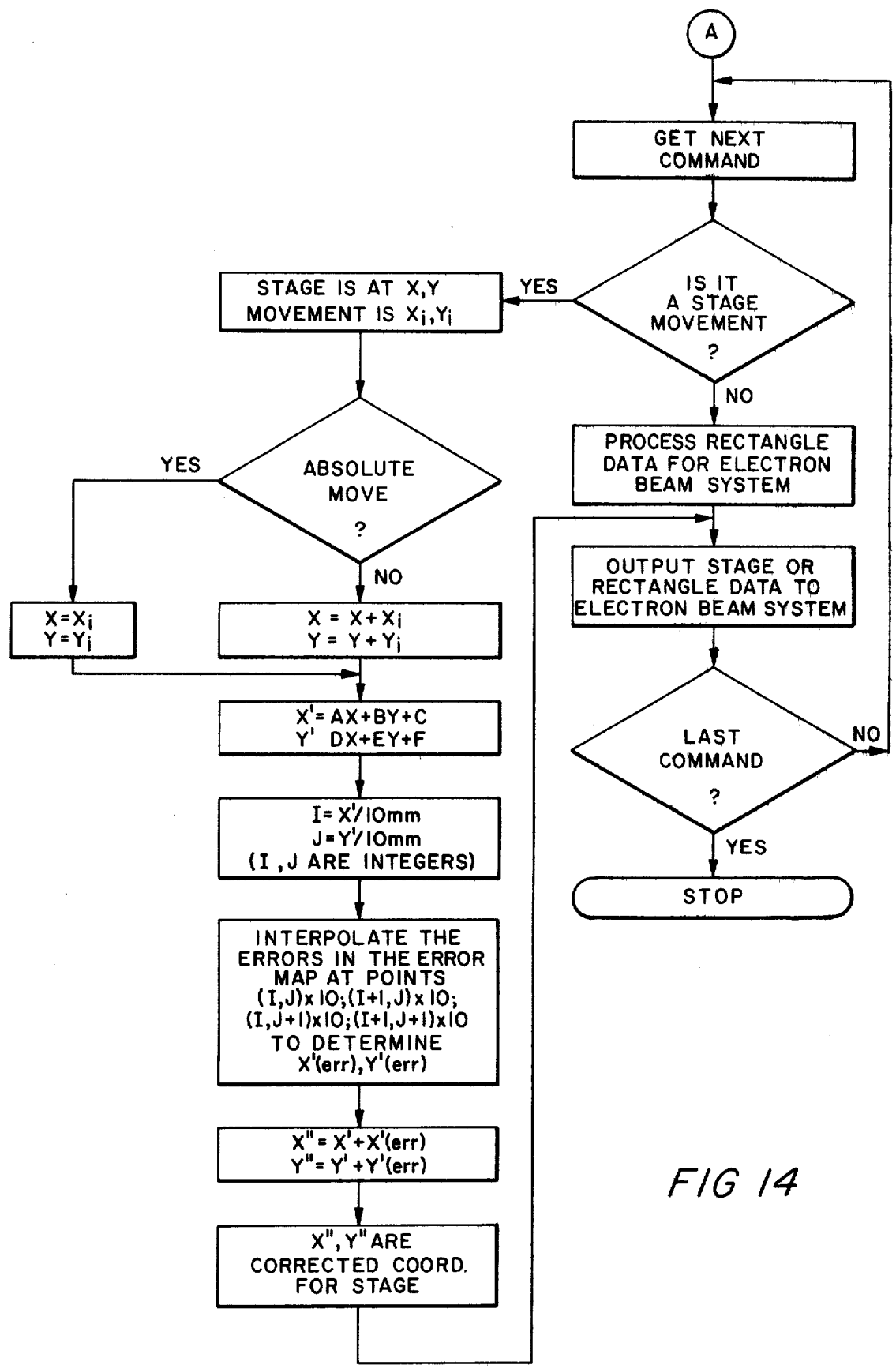
FIG. 14 is a flow chart depicting how the present invention corrects stage movement coordinates to compensate for the mirror distortion.

Whether a wafer or mask is being exposed, the program leaves FIG. 13 at A and enters the flow chart of FIG. 14 at A. FIG. 14 is a flow chart summarizing how the present invention is implemented.

In FIG. 14, it is seen that commands to the electron beam system are processed one at a time. If the command is to expose a rectangle, it is output to the electron beam system. If the command is a stage movement, the invention corrects the coordinate before outputting it to the electron beam system.

The new value of X,Y for the stage is determined, depending upon whether the move is specified as an absolute move to a new set of coordinates or a relative move with respect to the current position of the stage. The linear transformation equations are then used to calculate the coordinate $X',Y'$.

The example shown in FIG. 14 assumes the alignment crosses were exposed on a ten millimeter grid. As is indicated, the values of X and Y are divided by ten to form the values I and J, respectively. I and J are integers, that is, any remainder from the division process is discarded. Since I and J are integers, they specify the coordinates of the lower left hand corner of a square formed by the coordinates of four alignment crosses. The point $X',Y'$ is within this square. The coordinates of the four corners of the square are $(I,J) \times 10$, $(I+1,J) \times 10$, $(I,J+1) \times 10$ and $(I+1,J+1) \times 10$.

The errors at these four points, from the error map, are used to perform a four way interpolation on $X',Y'$. The error X(err), Y(err), at the point $X',Y'$, caused by the different mirror distortion of the electron beam system (different from the distortion of the system on which the glass plate was exposed) is the result of the four way interpolation. The corrected coordinates $X'',Y''$ are calculated by adding X(err), Y(err) to $X',Y'$, respectively, and are output to the electron beam system.

If either I or J, the result of the division described above, has no remainder, the coordinate X,Y is not within a square, but rather is on a line between two alignment crosses. In this case, only a two way interpolation is performed. If both I and J have no remainder, the coordinate $X',Y'$ is identical to the coordinate of an alignment cross. In this case, no interpolation is performed and the error, from the error map, is used directly to calculate $X'',Y''$.

The invention is not limited to two electron beam systems. The calibration concept can be applied to any number of systems. Further, once a "standard" glass calibration plate has been established on a first system, and if such first system is subsequently modified such that it no longer produces compatible plates, the first system could be recalibrated with the calibration plate.

What is claimed is:

1. A calibration system for making a plurality of scanning beam systems compatible one with another, each of said scanning beam systems including bean deflection control means for controlling the deflection of a scanning beam in response to beam deflection signals, and stage position control means for controlling the movement of a stage in response to stage position signals, said stage being selectively positioned in the path of said scanning beam, and said stage further being adapted to receive and hold an object that is to be scanned, whereby a desired pattern can be scanned on said object by said beam through selective control of said beam deflection and stage position signals, said calibration system comprising:

marking means for marking a calibration plate held on the stage of a first of said scanning beam systems with a plurality of calibration marks, each of said mark being positioned at a prescribed location on said calibration plate;

holding means for allowing said calibration plate to be removed from said first scanning beam system and inserted into another of said scanning beam systems;

measuring means for measuring the location of a plurality of said marks after said calibration plate has been inserted into said other scanning beam system;

mapping means for creating and using an error data map that indicates the difference between the prescribed location and the measured location; and correction means, responsive to said error data map, for selectively controlling the movement of the stage of said other scanning beam system so that a pattern exposed on an object placed thereon is aligned with a pattern scanned on said same object whenever said object is placed on the stage of said first system.

2. A calibration system as defined in claim 1 wherein the stage position signals include digital data that specify stage coordinate points, each stage coordinate point defining a precise location in a stage coordinate system where the stage may be positioned under control of said stage position control means, and wherein each prescribed location of said calibration marks is specified by a prescribed stage coordinate point; and further wherein the beam deflection signals control the deflection of the scanning beam in a beam coordinate system.

3. A calibration system as defined in claim 2 further including internal compensation means, for use with each of said scanning beam systems, for aligning the stage coordinate system with the beam coordinate system.

4. A calibration system as defined in claim 3 wherein said measuring means comprises a scanning electron microscope system that measures the location of said calibration marks by determining a coordinate point within the stage coordinate system where a particular calibration mark lies, the collection of all of said coordinate points comprising a set of measured coordinate points.

5. A calibration system as defined in claim 4 wherein the scanning beam of said scanning beam systems comprises an electron beam, and further wherein the scanning electron microscope system is realized from at least some of the components of said scanning beam system.

6. A calibration system as defined in claim 4 wherein said mapping means comprises means for fitting, with a minimum of error, the set of measured coordinate points with a corresponding set of prescribed stage coordinate points, said set of prescribed stage coordinate points specifying the prescribed location of the calibration marks on said calibration plate;

calculation means for converting the set of fitted measured coordinate points to a corresponding calculated set of coordinate points, said set of calculated coordinate points including compensation for position errors that include errors caused by a slightly different orientation of the calibration plate in said other scanning system that was present in said first scanning system; and computing means for determining a set of error coordinate points that specifies the error between the set of calibrated coordinate points and the set of measured coordinate points, and for storing this set of error coordinate points in said error data map.

7. A system as defined in claim 6 wherein said fitting means includes the use of a least squares calculation.

8. A calibration system as defined in claim 6 wherein said correction means includes interpolation means for determining the precise coordinates of a point within the stage coordinate system to which the stage must be moved in order to achieve the desired alignment.

9. A calibration system as defined in claim 6 wherein said holding means comprises a cassette adapted to detachably hold the object to be scanned, said cassette being further adapted to be detachably inserted into each of said scanning beam systems.

10. A calibration system as defined in claim 9 wherein said cassette further allows said object to be rotated at least 90 degrees within the stage coordinate system.

11. A system as defined in claim 10 further including an alignment chip permanently affixed to said cassette, said alignment chip having a plurality of alignment marks placed thereon at prescribed locations.

12. A system as defined in claim 11 wherein said internal compensation means comprises:

stage coordinate correction means for correcting the coordinate points that define the location of the calibration marks on said calibration plate;

beam coordinate correction means for compensating beam deflection signals to correct for non-linearities inherent in the beam deflection control means; and means for aligning the corrected stage coordinate system with the corrected beam coordinate system.

13. A system as defined in claim 12 wherein said internal compensation means further comprises means for aligning an object coordinate system with said stage coordinate system, said object coordinate system being that coordinate system used with a prior scanned object to define the location of a plurality of alignment marks on said prior scanned object.

14. A calibration method for use with two or more scanning beam systems that allows a first pattern exposed on an object placed in a first of said scanning beam systems to be aligned with a second pattern exposed on said object when said object is placed in any other of said scanning beam systems, said method comprising the steps of:

(a) marking a calibration plate in a first of said scanning beam systems with an array of calibration marks, each mark being positioned at a prescribed location;

(b) removing the calibration plate from the first scanning beam system and inserting it into another of said scanning beam systems;

(c) measuring the location of said calibration marks in said other system;

(d) creating and saving an error map for said other system that indicates the error between the prescribed location of each mark in the first system and the measured location of the same mark in said other system; and (e) using said error map to modify the positioning of the object in said other scanning beam system to eliminate relative positioning errors that exist between said scanning beam systems.

15. A calibration method as defined in claim 14 wherein step (a) of marking the calibration plate comprises the steps of:

(1) inserting a non-exposed plate into the first scanning beam system, said plate having material thereon that is sensitive to a scanning beam, (2) selectively moving said non-exposed plate within said first scanning beam system so that a non-deflected beam of said first scanning system exposes each of said calibration marks, the prescribed location of each calibration mark being defined by a set of coordinate points X,Y, of a first coordinate system within which the calibration plate moves, and (3) developing said plate so that said calibration marks appear at those locations where exposure from said beam has occurred.

16. A calibration method as defined in claim 15 wherein step (c) of measuring the location of the calibration marks comprises measuring and recording a set of coordinate points, X(meas), Y(meas), at which each measured calibration mark appears.

17. A calibration method as defined in claim 16 wherein step (d) of creating and saving an error map comprises:

(1) mathematically fitting the set of measured coordinate points X(meas), Y(meas) to the set of prescribed coordinate points X, Y in order to minimize the error therebetween, (2) transforming the prescribed coordinate points to calculated coordinate points, X(calc), Y(calc), said calculated coordinate points including correction factors for certain misalignment errors and nonlinearities that occur in the scanning beam systems, (3) determining the error, X(err), Y(err) between each measured coordinate point, X(meas), Y(meas), and the corresponding calculated coordinate point, X(calc), Y(calc), and (4) storing the values of X(err), Y(err) in an error map at locations where these error values can be selectively accessed and retrieved.

* * * * *